(12) United States Patent
Voigt et al.

(10) Patent No.: US 10,145,927 B2
(45) Date of Patent: Dec. 4, 2018

(54) MAGNETIC RESONANCE IMAGING WITH MOTION CORRECTION SUING PRE-PULSES AND NAVIGATORS

(71) Applicant: KONINKLIJKE PHILIPS N.V., Eindhoven (NL)

(72) Inventors: Tobias Ratko Voigt, Eindhoven (NL); Markus Olaf Samuel Henningsson, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 225 days.

(21) Appl. No.: 15/304,207

(22) PCT Filed: Apr. 17, 2015

(86) PCT No.: PCT/EP2015/058430
§ 371 (c)(1),
(2) Date: Oct. 14, 2016

(87) PCT Pub. No.: WO2015/162068
PCT Pub. Date: Oct. 29, 2015

(65) Prior Publication Data
US 2017/0038449 A1 Feb. 9, 2017

(30) Foreign Application Priority Data
Apr. 22, 2014 (EP) .................................... 14165487

(51) Int. Cl.
*G01R 33/565* (2006.01)
*G01R 33/483* (2006.01)
(Continued)

(52) U.S. Cl.
CPC ... *G01R 33/56509* (2013.01); *G01R 33/4838* (2013.01); *G01R 33/50* (2013.01); *G01R 33/5619* (2013.01); *G01R 33/5673* (2013.01)

(58) Field of Classification Search
None
See application file for complete search history.

(56) References Cited

U.S. PATENT DOCUMENTS 9,684,979 B2 * 6/2017 Lu ........................... A61B 5/055
9,835,705 B2 * 12/2017 Weingartner .......... A61B 5/055
(Continued)

OTHER PUBLICATIONS

White N et al: "Promo: Real-time prospective motion correction in MRI using image-based tracking",Magnetic Res0nance in Medicine, John Wiley&Sons, Inc, US,vol. 63, No. 1,Dec. 21, 2009 (Dec. 21, 2009), pp. 91-105.
(Continued)

*Primary Examiner* — Dixomara Vargas
*Assistant Examiner* — Douglas X Rodriguez

(57) ABSTRACT

The present invention provides a method for magnetic resonance (MR) imaging of a region of interest (142) of a subject of interest (120) under application of a scanning sequence (200) comprising at least one pre-pulse (202, 204) and multiple readouts (206), whereby the multiple readouts (206) are performed after the at least one pre-pulse (202, 204) with different configurations causing different image contrasts, comprising the steps of performing a preparation phase comprising applying at least one scanning sequence (200) to provide a set of reference readouts (206) using the different configurations, and generating a set of navigator images (210) with one navigator image (210) of the region of interest (142) for each configuration of the reference readouts (206), performing an examination phase comprising applying at least one scanning sequence (200), whereby at least one image (212) of the region of interest (142) is generated for each scanning sequence (200), determining motion of the subject of interest (120) by comparing at least one image (212) of the scanning sequence of the examination phase to the navigator image (210) having the same
(Continued)

configuration as the compared image (212), performing motion correction of the at least one image (212) based on the determined motion of the subject of interest (120) of the at least one image (212), and providing an MR scan (214) of the region of interest (142) of the subject of interest (120) based on the images (212) after performing motion correction. The invention also provides a MR imaging system (110) adapted to perform the above method and a software package for upgrading a MR imaging system (110), whereby the software package contains instructions for controlling the MR imaging system (110) according to the above method.

22 Claims, 7 Drawing Sheets

(51) Int. Cl.
    *G01R 33/50*     (2006.01)
    *G01R 33/561*     (2006.01)
    *G01R 33/567*     (2006.01)

(56) References Cited

U.S. PATENT DOCUMENTS

| | | | |
|---|---|---|---|
| 2006/0224062 A1* | 10/2006 | Aggarwal | G01R 33/5673 600/413 |
| 2006/0273791 A1* | 12/2006 | Beck | G01R 33/561 324/309 |
| 2013/0134976 A1 | 5/2013 | Sugiura | |
| 2013/0187649 A1 | 7/2013 | Bhat | |
| 2014/0024924 A1 | 1/2014 | Goto | |
| 2016/0139225 A1* | 5/2016 | Basha | G01R 33/36 324/309 |

OTHER PUBLICATIONS

Ramkumar Krishnamurthy et al: "Tools for cardiovascular magnetic resonance imaging", Cardiovasc Diagn Ther,vol. 4, No. 2,Apr. 1, 2014 (Apr. 1, 2014),pp. 104-125.

Ferreira VM, Piechnik SK, Dall'Armellina E, Karamitsos TD, Francis JM, Ntusi N, Holloway C, Choudhury RP, Kardos A, Robson MD, Friedrich MG, Neubauer S. T1 Mapping for the Diagnosis of Acute Myocarditis Using CMR: Comparison to T2-Weighted and Late Gadolinium Enhanced Imaging. JACC Cardiovasc. Imaging. 2013; 6:1048-1058.

Puntmann VO, Voigt T, Chen Z, Mayr M, Karim R, Rhode K, Pastor A, Carr-White G, Razavi R, Schaeffter T, Nagel E. Native T1 Mapping in Differentiation of Normal Myocardium From Diffuse Disease in Hypertrophic and Dilated Cardiomyopathy. JACC Cardiovasc. Imaging. 2013; 6:475-484.

Voigt T, Schaeffter T, Botnar R, Smink J, Henningsson M. Three-Dimensional Molli for Myocardial T1 Mapping Using Respiratory Navigation and Inversion Time Gating. In: Proceedings of the 21st Annual Meeting of ISMRM. Salt Lake City, USA: 2013. p. 258.

Henningsson M, Smink J, Razavi R, Botnar RM. Prospective respiratory motion correction for coronary MR angiography using a 2D image navigator. Magn. Reson. Med. 2013; 69:486-494.

Henningsson et al "3D Saturation Recovery Imaging for Free Breathing Myocardial TI Mapping" Proc. Intl.Soc. Mag. Reson. Med. 21 (2013) p. 4520.

\* cited by examiner

MAGNETIC RESONANCE IMAGING WITH MOTION CORRECTION SUING PRE-PULSES AND NAVIGATORS

CROSS REFERENCE TO RELATED APPLICATIONS

This application is a U.S. national phase application of International Application No. PCT/EP2015/058430, filed on Apr. 17, 2015, which claims to benefit of EP Application Serial No. 14165487.1 filed on Apr. 22, 2014 and is incorporated herein by reference.

FIELD OF THE INVENTION

The invention relates to the field of magnetic resonance imaging using pre-pulses.

BACKGROUND OF THE INVENTION

Different techniques for magnetic resonance (MR) imaging using pre-pulses are known in the Art, e.g. in the area of cardiovascular MR imaging. For example longitudinal relaxation time (T1) mapping is becoming an increasingly valuable tool in cardiovascular MR to diagnose a range of cardiomyopathies. T1 mapping is done using pre-pulses to interrogate the recovery behavior of the magnetization and performing readouts after given delays with respect to the pre-pulses. Due to the number of interrogation points required for performing required readouts, typical scanning sequences require at least two pre-pulses. In other configurations, different flip angles can be used for the readout, also resulting in images having different image contrasts. In other setups, different b-values can be used, e.g. in diffusion weighted imaging, also resulting in images having different image contrasts.

Three dimensional imaging of the upper thorax is challenged due to respiratory motion, so that the MR image generation is performed best under breath-hold condition. Nevertheless, a typical T1 scanning sequence with at least two pre-pulses, as described above, may last for about 16 seconds. These scan times are not suitable for scanning under breath-hold condition, in particular when considering that the subject of interest, i.e. the patient, is frequently undergoing the MR scan because of serious problems in the upper chest, which may impede maintaining breath-hold condition for the required time of at least an entire scanning sequence. Therefore, e.g. clinical T1 mapping scans have been largely limited to 2D breath-hold acquisitions with resulting restrictions in the achievable spatial resolution and signal-to-noise ratio.

To overcome these limitations, free-breathing 3D T1 mapping has been investigated using respiratory motion correction by means of conventional diaphragmatic 1D navigation. Diaphragmatic beam navigators can be used to gate or track breathing motion, or even both, to compensate detected breathing motion. This however, has not proven reliable and leads to long scan times and low scan efficiencies, which can even be below fifty percent.

The journal article White, Nathan, et al. "PROMO: Real-time prospective motion correction in MRI using image-based tracking." Magnetic Resonance in Medicine 63.1 (2010): 91-105 discloses the PROMO magnetic resonance imaging protocol, which is a Real-time prospective motion correction for MRI using Image-based tracking.

The journal article Krishnamurthy, Ramkumar, Benjamin Cheong, and Raja Muthupillai. "Tools for cardiovascular magnetic resonance imaging." Cardiovascular diagnosis and therapy 4.2 (2014): 104 discloses the use of cardiac gating by detecting the upslope of an 'R' wave in the ECG signal to minimize the detrimental effect of cardiac motion on image quality. This article also discloses several methods of compensating for respiratory motion, which include: breath-holding, averaging, respiratory ordered phase encoding, and the use of navigator echoes. The navigator echoes are used to discard data if the heart and/or diagphram are not within a prescribed user position, and is described as being time consuming and technologically challenging to implement.

United States patent application US 2013/0134976 A1 discloses a magnetic resonance imaging apparatus according to embodiments includes an executing unit, an informing unit, a detecting unit, and a determining unit. The executing unit executes a pulse sequence to collect data of a subject at a constant cycle. The informing unit informs the subject of a timing of breathing in synchronization with the cycle at which the pulse sequence is executed. The detecting unit detects a breathing level or a respiratory cycle of the subject. The determining unit determines, when the pulse sequence is executed, whether to use the data collected by the pulse sequence for image reconstruction in accordance with the breathing level or the respiratory cycle of the subject.

SUMMARY OF THE INVENTION

The invention provides for a method of magnetic resonance imaging, a software package, and a magnetic resonance (MR) imaging system in the independent claims. Embodiments are given in the dependent claims.

The invention may provide a method for magnetic resonance imaging using pre-pulses, a MR imaging system for performing the above method, and a software package for upgrading a MR imaging system to perform the above method, which enable magnetic resonance imaging with high efficiency, high resolution, good image quality and few artifacts for a wide range of subjects of interest, in particular in regions of interest affected by breathing motion of the subject of interest.

Embodiments of the invention may provide for a method for magnetic resonance (MR) imaging of a region of interest of a subject of interest under application of a scanning sequence comprising at least one pre-pulse and multiple readouts, whereby the multiple readouts are performed after the at least one pre-pulse with different configurations causing different image contrasts, comprising the steps of performing a preparation phase comprising applying at least one scanning sequence to provide a set of reference readouts using the different configurations, and generating a set of navigator images with one navigator image of the region of interest for each configuration of the reference readouts, performing an examination phase comprising applying at least one scanning sequence, whereby at least one image of the region of interest is generated for each scanning sequence, determining motion of the subject of interest by comparing at least one image of the scanning sequence of the examination phase to the navigator image having the same configuration as the compared image, performing motion correction of the at least one image based on the determined motion of the subject of interest of the at least one image, and providing an MR scan of the region of interest of the subject of interest based on the images after performing motion correction.

The above example may be used in a variety of situations. In some cases, the method may be used to correct for periodic motion such as breathing or cardiac motion. In other cases, non-periodic motion may also be corrected for. For example the at least one image of the scanning sequence is compared to the matching image of the navigator image. The contrast of the corresponding images match, so standard methods of detecting motion such as in plane translational or rotational motion can readily be detected. A shift of the subject from one position to another can be detected. The technique can also be used for detecting periodic motion. The exact nature of the motion is able to be identified because the contrast of the navigator images corresponds to the contrast of the image of the corresponding scanning sequence.

The object may also achieved by a software package for upgrading a MR imaging system, whereby the software package contains instructions for controlling the MR imaging system according to the above method.

The object may be further achieved by a MR imaging system for providing an image representation of a region of interest of a subject of interest positioned in an examination space of the MR imaging system, wherein the MR imaging system is adapted to perform the above method for magnetic resonance imaging.

With the preparation phase, a set of navigator images of the subject of interest can be provided, which serve for motion determination, also referred to as motion detection, and/or motion correction within the examination phase. Since the same scanning sequence is applied in the preparation phase and in the examination phase, reference navigator images with the correct contrast properties for all required configurations can be provided. Hence, images generated during the examination phase can be generated and/or processed using motion detection and/or motion correction. Accordingly, the detected motion can be used to apply countermeasures in respect to the readout, e.g. by adapting the position of the subject of interest, or the detected motion can be used to perform a processing of the data after the readout in order to provide consistent data for the MR scan, e.g. by matching MR images. Hence, a 3D scan of the region of interest of the subject of interest can be provide using MR techniques based on the readouts of the examination phase without the necessity for breath-hold condition.

According to the invention, image-based navigation allows for direct respiratory motion estimation of the region of interest instead of the diaphragm. Disadvantages of the use of a diaphragmatic 1D navigator in MR imaging like a specific correction factor which describes the relation between diaphragmatic and motion of the region of interest can be avoided. This is beneficial, since the specific correction factor depends on the properties of the subject of interest. Using the image navigators, a simple model can be used to compensate for respiratory induced deformation of the region of interest. The accuracy of the motion detection can be increased depending on the complexity of the model.

Also scanning times, which can be unacceptably long when using 1D-diaphragmaic navigators, can be reduced. Furthermore, compromises in resolution and image quality when using 1D-diaphragmaic navigators can be overcome. With image-based navigation the scanning efficiency can be significantly increased.

Problems in image based navigation, which may result e.g. from different image properties, e.g. different contrasts, of the images for the different configurations of the readouts, can be overcome. Accordingly, errors in motion detection and motion correction based on use of a single navigator reference all readout configurations can be avoided, and a compensation for different image properties, e.g. different image contrasts, is not required.

Motion detection can be performed always in respect to the navigator images as an absolute basis. Nevertheless, once the examination phase is started, any image, for which motion in respect to the navigator image has been detected, can be used as relative basis for motion detection.

The configurations of the readouts may be fixed in respect to the used scanning sequence. Accordingly, image based motion detection is facilitated since for each image provided during the examination phase, one navigator image is provided having the same image properties, e.g. the same contrast values.

Each readout of the scanning sequence may be used for generation of an image to perform motion correction. Hence, continuous motion correction with short delays is enabled.

Providing an MR scan of the region of interest of the subject of interest based on the readouts may comprise combining the images used for motion detection/correction under consideration of the detected motion. Nevertheless, also information from readouts with different configurations can be commonly processed to provide the MR scan of the region of interest of the subject of interest.

The different configurations refer to different parameter settings for the readouts, resulting in different image properties like image contrasts. The parameter settings may comprise settings for e.g. flip angle or b-values. The parameter settings may refer to settings for different parameters, depending on the type of pre-pulse and desired MR scan information. E.g. for T1 mapping using T1 pre-pulses, the flip angle may be varied, whereas for diffusion weighted imaging, the b-values may be varied.

According to another embodiment the multiple readouts are performed with different delays after the at least one pre-pulse. Hence, the different delays of the readouts after the at least one pre-pulse refer to the different configurations of the readouts. Preferably, the delays of the readouts are fix in respect to the at least one pre-pulse. Accordingly, image based motion detection is facilitated since for each image provided during the examination phase, one navigator image can be provided in the preparation phase having the same image properties, e.g. the same contrast values. In case of multiple pre-pulses, the delays of the multiple pre-pulses can be fixed for the scanning sequence, e.g. readouts after the first pre-pulse are performed with first, fixed delays, readouts after the second pre-pulse are performed with second, fixed delays, and so on.

According to another embodiment the method for MR imaging is performed as a method for cardiovascular MR imaging and the region of interest of the subject of interest is the heart of the subject of interest. Pre-pulses are frequently used when performing MR imaging of the heart, so that the proposed method is suitable for use in cardiovascular MR imaging. With the use of 2D/3D navigator images in cardiovascular MR imaging, disadvantages of the use of a diaphragmatic 1D navigators can be overcome. The use of 1D navigators in MR imaging is typically based on a specific correction factor, which describes the relation between diaphragmatic and heart motion. The correction factor typically depends on the subject of interest, and accordingly has to be determined prior to performing the MR scan. When using 2D/3D image navigators, the use of a correction factor can be avoided, thereby speeding up the workflow for generation of a MR scan. Using the image navigators, a simple model can be used to compensate for respiratory induced deformation of the heart. Nevertheless, the accuracy of the motion detection can be increased depending on the complexity of the model.

In another embodiment the region of interest is any one of the following: a liver, a spleen, a rectum, a kidney, an abdominal organ, a lung, and combinations thereof.

According to another embodiment the step of performing a preparation phase comprises issuing a breath-hold command to the subject of interest, and executing at least one scanning sequence under breath-hold condition. Accordingly, the preparation phase can be performed with high reliability in respect to the generation of the navigator images, so that based on the highly reliable navigator images, motion detection/correction can also be performed with high reliability. Although breath-hold can be challenging for a subject of interest, e.g. depending on its health condition, the need for breath-hold condition can be applied to the preparation phase only, which is a limited time. Thereby, the effort for the subject of interest can be limited. A typical preparation phase can be conducted with breath-hold in less than 10 seconds, thus adding only little additional scan time. Further preferred, the scanning sequence in the preparation phase is performed only once, so that only one successful breath-hold for the duration of one scanning sequence is required. The scanning sequence in the preparation phase can be performed as interrupted sequence with multiple parts, thereby allowing the subject of interest to breathe in-between different parts of the scanning sequence. E.g. when the scanning sequence comprises multiple pre-pulses, a first part may comprises the first pre-pulse and the subsequent readout, and a second part and further following parts comprise the second or the respective following pre-pulse and the respective readout(s) following the second or the respective following pre-pulse. Accordingly, breath-hold time can be limited to short times, i.e. times shorter than the entire scanning sequence.

According to another embodiment the step of performing a preparation phase comprises executing at least one scanning sequence under free-breathing condition using a 1D navigator. Accordingly, the preparation phase can be performed in a short time without the need of the subject of interest co-operating in the preparation phase. Accordingly, the preparation phase can be performed also in cases where the subject of interest is e.g. not conscious or for other reasons not capable of performing breath-hold. The standard 1D diaphragm navigators are used in the preparation phase only. Accordingly, the preparation phase can be finished in a typical time of less than 10 seconds in the case of using a scanning sequence having two pre-pulses.

According to another embodiment the step of applying at least one scanning sequence comprises applying a pre-pulse as T1- or T2-pulse. T1 and T2-pulses are both suitable e.g. to provide cardiovascular information of the subject of interest. A T1-pulse refers to a saturation pulse or an inversion pulse to achieve magnetic saturation or inversion of the region of interest of the subject of interest. Different configurations are preferably provided as different delays after the pre-pulses. The delays are typically referred to as inversion times. T1 pulses are used to determine spin-lattice relaxation, also referred to as longitudinal relaxation time T1. T2 pulses are used to determine spin-spin relaxation, also referred to as transverse relaxation time T2. T1-weighted images are generally useful e.g. for assessing the cerebral cortex, identifying fatty tissue, characterizing focal liver lesions and for post-contrast imaging. T2-weighted images are generally useful e.g. for detecting edema, revealing white matter lesions and assessing zonal anatomy in the prostate and uterus.

According to another embodiment the step of applying at least one scanning sequence comprises applying a scanning sequence having multiple pre-pulses and multiple readouts, whereby each pre-pulse is followed by at least one readout. Accordingly, readouts having different configurations can be easily applied, e.g. readouts with the same delay and different parameters can be performed, when one of the readouts is performed after the first pre-pulse and the other readout is performed with the same delay but different parameters, e.g. a different flip angle, after the second pre-pulse. Furthermore, when multiple readouts are required with only small differences in the delay after a pre-pulse, processing of the readout can be performed without being time critical. This enables immediate processing of readout data after the readout. A typical scanning sequence e.g. for T1 mapping is a 2-3 scanning sequence, where two readouts are performed after the first T1 pre-pulse and three readouts are performed after the second T1 pre-pulse.

According to another embodiment the step of applying a scanning sequence having multiple pre-pulses and multiple readouts comprises adding a recovery time prior to generating a pre-pulse. The recovery can be required, in particular depending on the kind of pre-pulse applied in the scanning sequence, e.g. in the case of T1 pre-pulses, a recovery time can be inserted before each inversion pulse to ensure full recovery of the magnetic spins. The recovery time in this case can cover e.g. three heart beats. The recovery time is preferably applied prior to the second and each subsequent pre-pulse. Accordingly, the recovery time can be inserted at least between subsequent pre-pulses of the scanning sequence. With the recovery time being inserted prior to the pre-pulse, reliable MR imaging can be ensured, e.g. cardio-vascular MR imaging. Depending on the application of the scanning sequences, it may also be beneficial to add a recovery time before the first pre-pulse.

According to another embodiment the method comprises the step of monitoring a motion detection signal of the subject of interest, and the step of applying at least one scanning sequence comprises triggering the scanning sequence based on the motion detection signal of the subject of interest. Preferably, the at least one pre-pulse is triggered based on the motion detection signal of the subject of interest. Accordingly the scanning sequence as a whole can be triggered based on the motion detection signal of the subject of interest. Alternatively, with a scanning sequence having multiple pre-pulses, each of the pre-pulses can be triggered individually to enable performing the readouts with desired states of motion of the subject. Therefore, readouts with different delays after a pre-pulse can be acquired having the same state of motion. E.g. it can be preferred to perform the measurements in a state of the heart or lungs, where it is in a relaxed state. Nevertheless, the readouts can be performed with different delays in respect to the pre-pulses. Hence, when a desired readout with a desired motion state of the subject is to be performed, the triggering can be adapted depending on the desired delay of the readout after the pre-pulse. With triggering of the scanning sequence, readouts can be performed always in the same configuration in respect to the pre-pulse timing and the motion of the subject.

In another embodiment the motion detection signal is a respiratory signal.

According to another embodiment the method comprises the step of monitoring a heartbeat signal of the subject of interest, and the step of applying at least one scanning sequence comprises triggering the scanning sequence based on the heartbeat signal of the subject of interest. Preferably, the at least one pre-pulse is triggered based on the heartbeat signal of the subject of interest. Accordingly the scanning sequence as a whole can be triggered based on the heartbeat signal of the subject of interest. Alternatively, with a scanning sequence having multiple pre-pulses, each of the pre-pulses can be triggered individually to enable performing the readouts with desired states of motion of the heart. Therefore, readouts with different delays after a pre-pulse can be acquired having the same heart beat state. E.g. it can be preferred to perform the measurements in a state of the heart, where it is in a relaxed state. Nevertheless, the readouts can be performed with different delays in respect to the pre-pulses. Hence, when a desired readout with a desired motion state of the heart is to be performed, the triggering can be adapted depending on the desired delay of the readout after the pre-pulse. With triggering of the scanning sequence, readouts can be performed always in the same configuration in respect to the pre-pulse timing and the motion of the heart.

The heartbeat signal could be in one example an ECG signal. The triggering of the scanning sequence could be performed using cardiac gating. For example, the upslope of an "R" wave in the ECG signal could be used as a trigger. The trigger could also be a predetermined delay from the detection of the upslope of the "R" wave in the ECG signal.

The triggering of the scanning sequence by the heartbeat signal could be accomplished in different ways. For example the wave form of the heartbeat signal could be monitored. The heartbeat of a subject will normally have a recognizable pattern or waveform. As a result the heartbeat signal can be used to trigger the application of the scanning sequence in a reliable and predictable manner. A simple way of doing this would be to trigger the application of the scanning sequence or pre-pulse using a thresholded value. For instance, a maximum or minimum value could be set as the trigger. A delay could also be used to control when the trigger occurs.

In a similar example the derivative of the heartbeat signal could be used as a trigger. In this case, a delay could also be used to control when the trigger occurs in the heartbeat.

As the heartbeat has a regular pattern, particularly for the ECG, other methods could be used to trigger the scanning sequence. For example a pattern recognition algorithm could be used to identify the phase or state of the subjects heart and trigger the scanning sequence.

In one example, the examination phase is performed after completion of the preparation phase.

According to another embodiment the step of performing an examination phase comprises performing segmented k-space acquisition. The different k-space segments can be used to improve the spatial resolution of the MR cardiovascular scan and to reduce artifacts. Based on the motion detection/correction, the different k-space segments can be combined to provide the MR scan of the region of interest.

According to another embodiment the step of generating a set of navigator images with one navigator image for each configuration of the reference readouts comprises generating 2D or 3D navigator images for each configuration of the reference readouts. Accordingly, also the images based on the readouts of the at least one scanning sequence of the examination phase have to be 2D or 3D, respectively. Based on the 2D or 3D images, motion detection can be performed in two or three dimensions. 2D images are preferably provided to enable motion correction in a plane covering the head-foot and left-right directions of the subject of interest. Typically, this plane refers to the horizontal plane, i.e. when MR imaging is performed with a lying subject of interest. 3D motion detection/correction is preferred, but requires higher computational effort.

According to another embodiment the step of performing an examination phase comprises performing the examination phase as free-breathing examination phase. Hence, this method is suitable for all subjects of interest, even with limitations due to health state or when being un-conscious.

According to another embodiment the step of determining motion of the subject of interest by comparing at least one image of the scanning sequence of the examination phase to the navigator image having the same configuration as the compared image comprises determining the motion of the subject of interest in real-time. With the real-time motion detection, motion can be detected for any pair of images, typically for any pair of subsequent images. Accordingly, image motion correction can be applied already during the examination phase, so that the MR imaging system can be efficiently operated.

According to another embodiment the step of performing motion correction based on the determined motion of the subject of interest in real-time comprises performing real-time motion correction by adjusting MR scanning parameters for compensation of detected motion of the subject of interest. This enables motion correction already when a readout is generated or even prior to performing a readout. Hence, image post-processing and/or post-processing of the readout information after acquisitions of the desired readouts can be reduced.

According to another embodiment the step of performing real-time motion correction by adjusting MR scanning parameters for compensation of detected motion of the subject of interest comprises adjusting detection frequency in the readout direction, detection phase in the readout direction, and slice encoding direction. When adjusting the scanning parameters, motion correction can easily be performed for the readout. Motion correction is preferably performed after performing the readout in respect to the readout, for which motion is detected. Alternatively, motion correction can be performed already prior to a readout, i.e. motion can be estimated prior to a readout based e.g. on the previous readout, so that respective motion correction can be applied in advance. Adjusting detection phase enables control of the phase shift applied to the respective k-space lines of the imaging sequence. Adjusting slice encoding direction is particularly suitable when using 3D imaging.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It is understood that one or more of the aforementioned embodiments of the invention and/or examples may be combined as long as the combinations are not mutually exclusive.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Like numbered elements in these figures are either equivalent elements or perform the same function. Elements which have been discussed previously will not necessarily be discussed in later figures if the function is equivalent.

Figure 1:
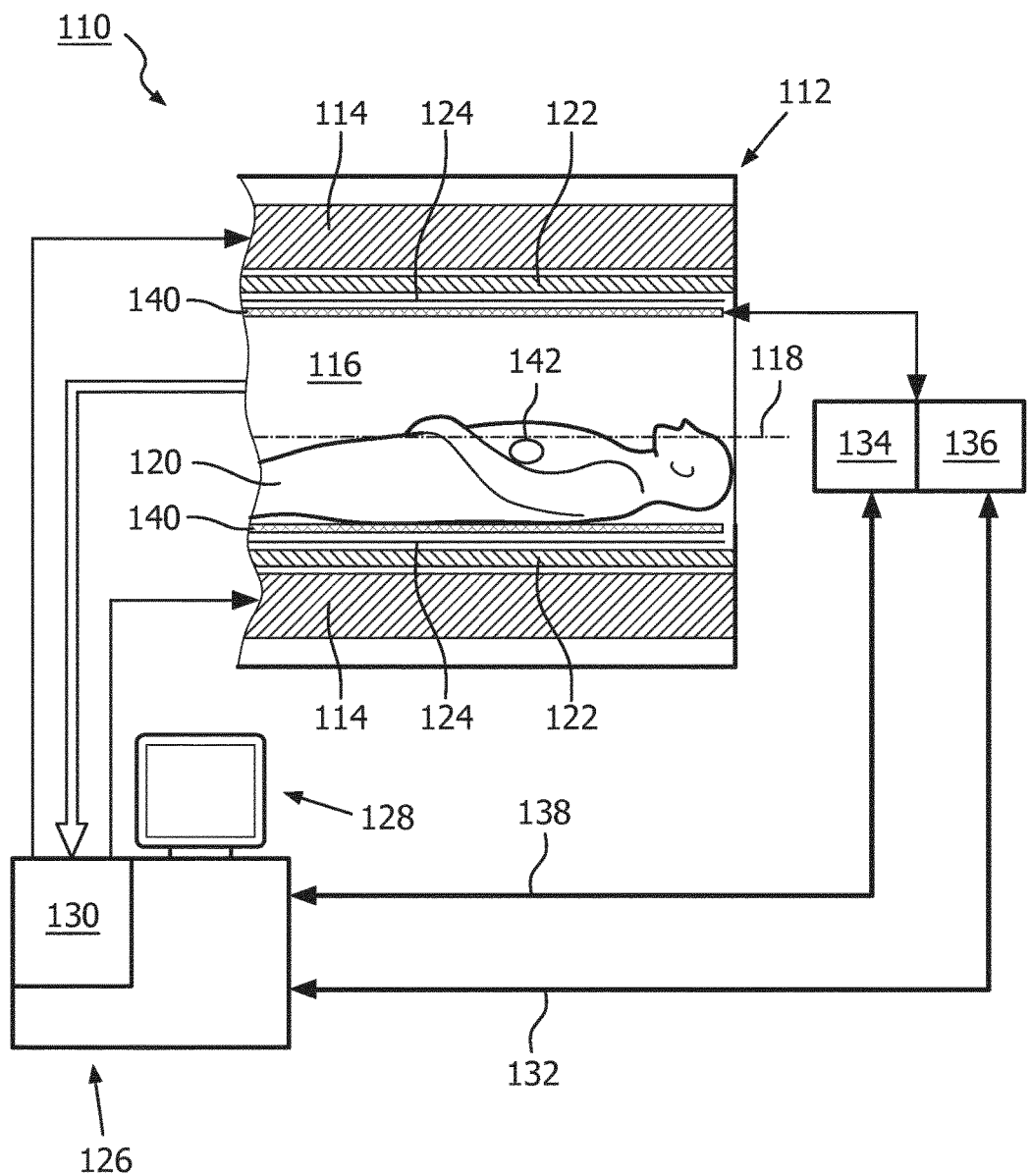
FIG. 1 is a schematic illustration of a part of a magnetic resonance (MR) imaging system in accordance with the invention.

FIG. 1 shows a schematic illustration of an embodiment of a magnetic resonance (MR) imaging system 110 in accordance with the invention. The MR imaging system 110 can be a MR imaging system known in the Art, which is operated as described later in detail to perform MR imaging, in particular to perform cardiovascular MR imaging.

The MR imaging system 110 comprises an MR scanner 112. The MR imaging system 110 further includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 has a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120, in particular in a region of interest 142, which shall be covered by MR images. In respect to cardiovascular MR imaging, the region of interest 142 refers to a region of the chest comprising the heart of the subject of interest 120. The RF antenna device 140 is also provided to receive MR signals from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil system 122 and the RF antenna device 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
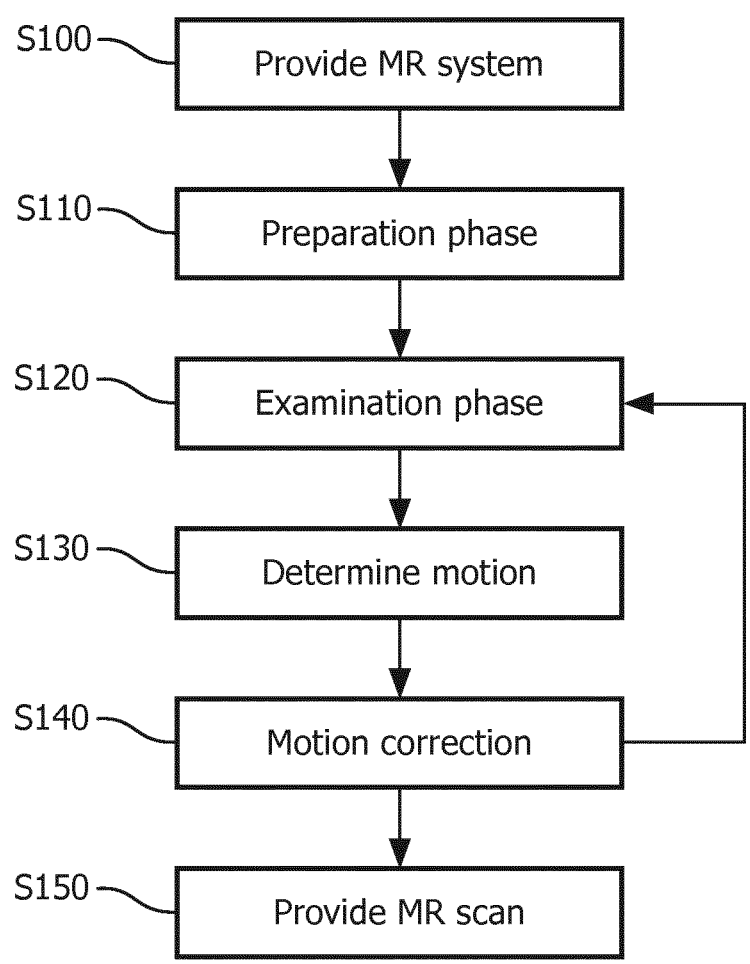
FIG. 2 is a flow chart indicating a method for cardiovascular magnetic resonance (MR) imaging according to a first, preferred embodiment.

With reference to FIG. 2 is now described a method for magnetic resonance (MR) imaging according to a first, preferred embodiment. According to the first embodiment, cardiovascular MR imaging is performed.

In step S100 the above MR imaging system 110 is provided. Furthermore, the subject of interest 120 is located in the examination space 116. Still further, in this step a scanning sequence 200 is defined, which can be seen in FIG. 3. The scanning sequence 200 is a 2-3 scanning sequence 200 for T1 mapping and comprises two T1 pre-pulses 202, 204 and five readouts 206, whereby two readouts 206 are performed after the first T1 pre-pulse 202 and three readouts 206 are performed after the second T1 pre-pulse 204. The T1 pre-pulses 202, 204 have a timing distance of approximately eight seconds. A T1 pre-pulse 202, 204 refers to a saturation pulse or an inversion pulse to achieve magnetic saturation or inversion of the subject of interest 120.

The readouts 206 are performed with different configurations resulting in different image contrasts, i.e. the readouts 206 have different delays relative to the pre-pulses 202, 204 in this embodiment. The delays of the readouts 206 are also referred to as inversion times (TI). The inversion times of the different readouts 206 are 60 ms and 1060 ms respectively, after the first T1 pre-pulse 202, and 500 ms, 1500 ms, and 2500 ms, respectively, after the second T1 pre-pulse 204. The inversion times are fixed for the entire method. This scanning sequence 200 provides a recovery time prior to the second pre-pulse 204, which corresponds in this embodiment to three heart beats, as can be seen from the electrocardiogram (ECG) 208 shown in FIG. 3.

Figure 3:
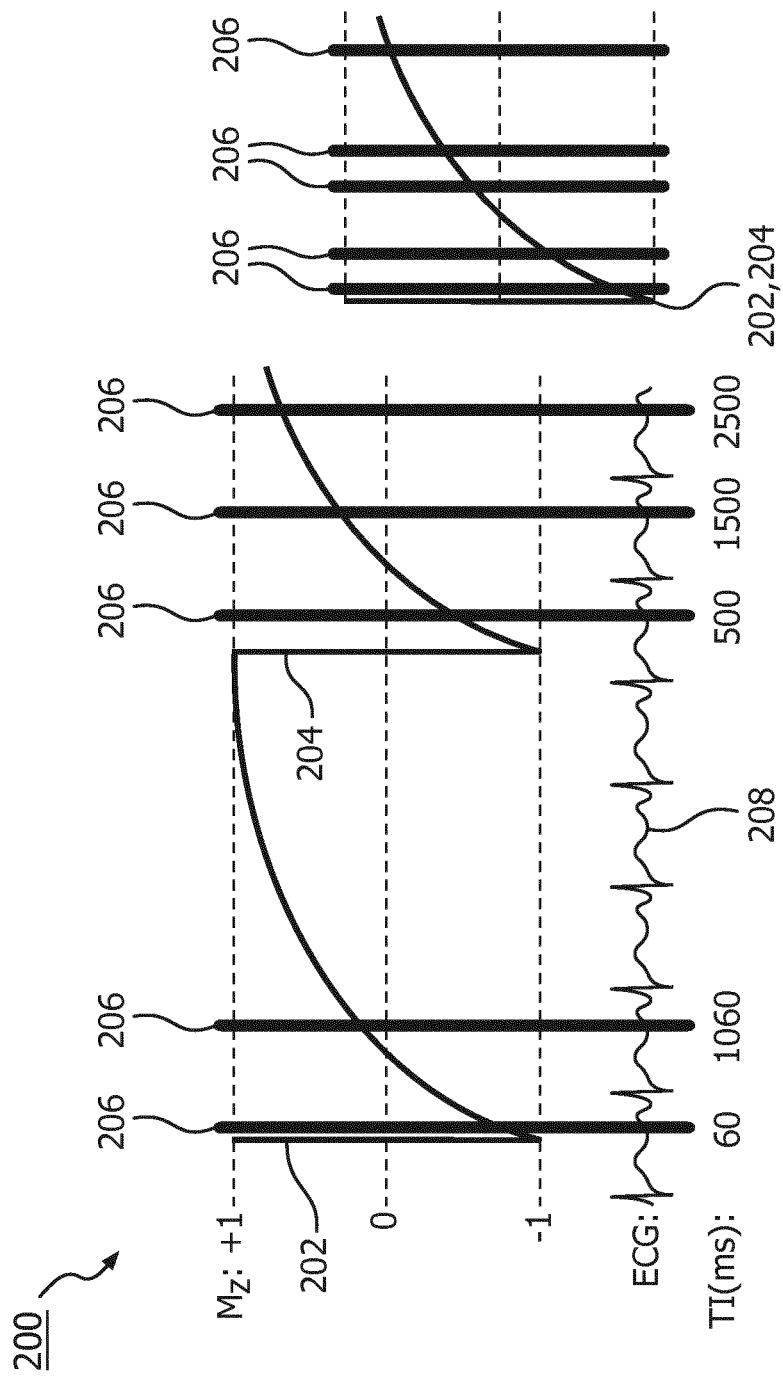
FIG. 3 is diagram showing a scanning sequence in accordance with the method according to the first embodiment.
Figure 4:
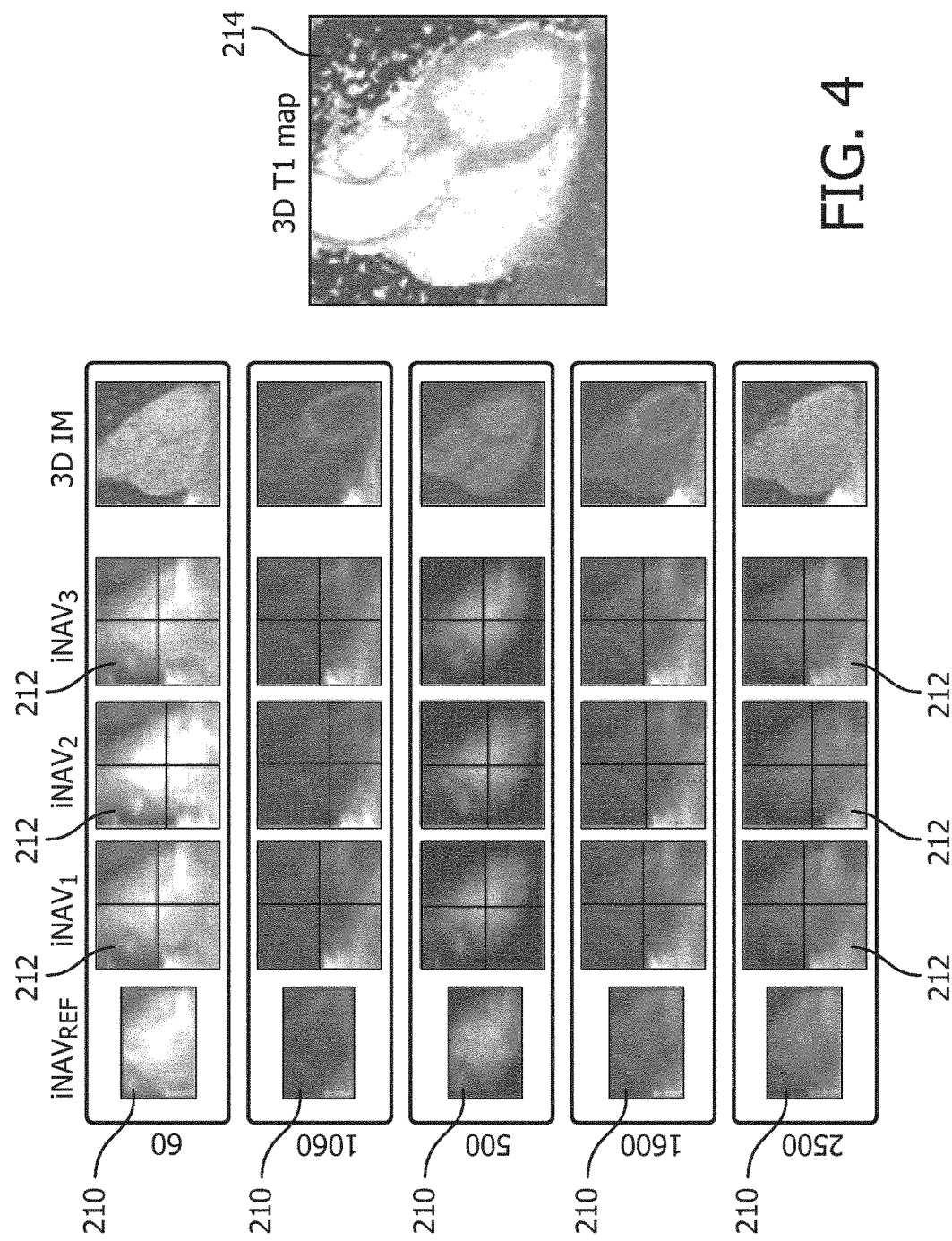
FIG. 4 is diagram showing a set of navigator images taken in the preparation phase and a set of images taken in the examination phase for different inversion times in accordance with the method according to the first embodiment.
Figure 5:
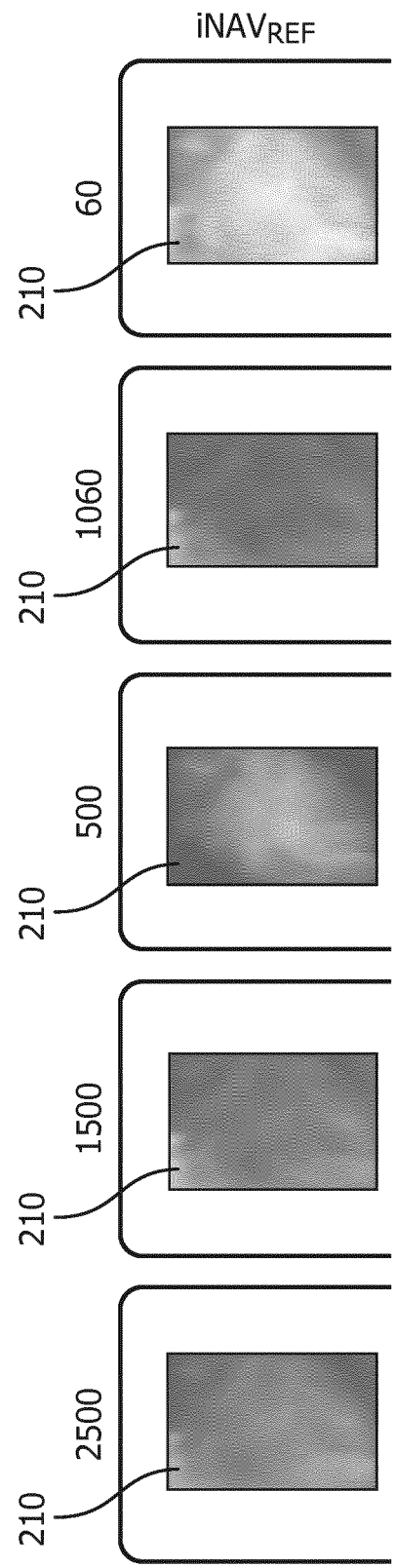
FIG. 5 is a diagram showing the contrast of different navigator images having different inversion times in accordance with the method according to the first embodiment.

In step S110 a preparation phase is performed. Accordingly, a breath-hold command is issued to the subject of interest 120 and one scanning sequence 200 is performed with breath-hold condition. As can be seen in FIG. 3, the part of the scanning sequence 200 required for acquiring the readouts 206 is approximately ten seconds, i.e. the time from the first pre-pulse 202 to the second pre-pulse 204 and the maximum inversion time after the second T1 pre-pulse 204. The heartbeat signal of the subject of interest 120 seen in the ECG 208 is used for triggering the scanning sequence 200. It is to be noted that in FIG. 3 the heartbeat frequency is approx. 60 beats/s, and the given time values refer to delays of the subsequent readouts 206 after the respective pre-pulse 202, 204. In the preparation phase, the readouts 206 are used as reference readouts 206 to generate a set of navigator images 210 with one navigator image 210 for each delay of the reference readouts 206 relative to the T1 pre-pulses 202, 204. The set of navigator images 210 can be seen in FIG. 4, labeled as $iNAV_{REF}$. As can be seen in detail in FIG. 5, the contrast of the navigator images 210 varies depending on the inversion time. As can be seen in FIG. 4 or 5, the navigator images 210 are provided as 2D navigator images 210, one for each delay of the respective reference readouts 206, for motion correction in a plane covering the head-foot and left-right directions of the subject of interest 120, as discussed in detail below.

In step S120 an examination phase is performed. Accordingly, multiple scanning sequences 200 are applied. The scanning sequences 200 are triggered by the ECG, as discussed with reference to step S110. Accordingly, the readouts 206 are always performed at the same movement state of the heart of the subject of interest 120, both for the preparation phase and for the examination phase. For each readout 206, an image 212 is generated, as indicated in FIG. 4, where by way of example images 212 for the readouts 206 of three scanning sequences 200 are depicted. As indicated in FIG. 3, the scanning sequence 200 covers two segments of k-space, thereby performing segmented k-space acquisition. The readouts 206 are combined, as can be seen in the right part of FIG. 3, where the combined readouts 206 are depicted relative to a single T1 pre-pulse 202, 204. The examination phase is performed as free-breathing examination phase. During the examination phase, the recovery time is also applied prior to the first pre-pulse 202.

In step S130 motion is determined for each image 212 in real-time. Accordingly, each image 212 of the scanning sequence 200 is compared to the navigator image 210 having the same delay as the compared image 212 to determine motion of the subject of interest 120. Motion detection in this embodiment is performed always in respect to the navigator images 210. In an alternative embodiment, motion detection is performed only for the first scanning sequence 200 based on the navigator images 210. Motion detection for subsequent scanning sequences 200 is performed with respect to the respective images 212 of the prior scanning sequence 200, i.e. motion detection is performed with respect to the prior image 212 corresponding to the readout 206 having the same configuration.

In step S140 motion correction is performed based on the determined motion of the subject of interest 120 in real-time (RT). Accordingly, countermeasures are undertaken to compensate detected motion of the subject of interest 120 in the readout 206. Hence, after each readout 206, MR scanning parameters are adjusted for compensation of detected motion of the subject of interest 120. In particular, detection frequency in the readout direction, detection phase in the readout direction, and slice encoding direction are adapted based on the determined motion of the subject of interest 120.

Figure 6:
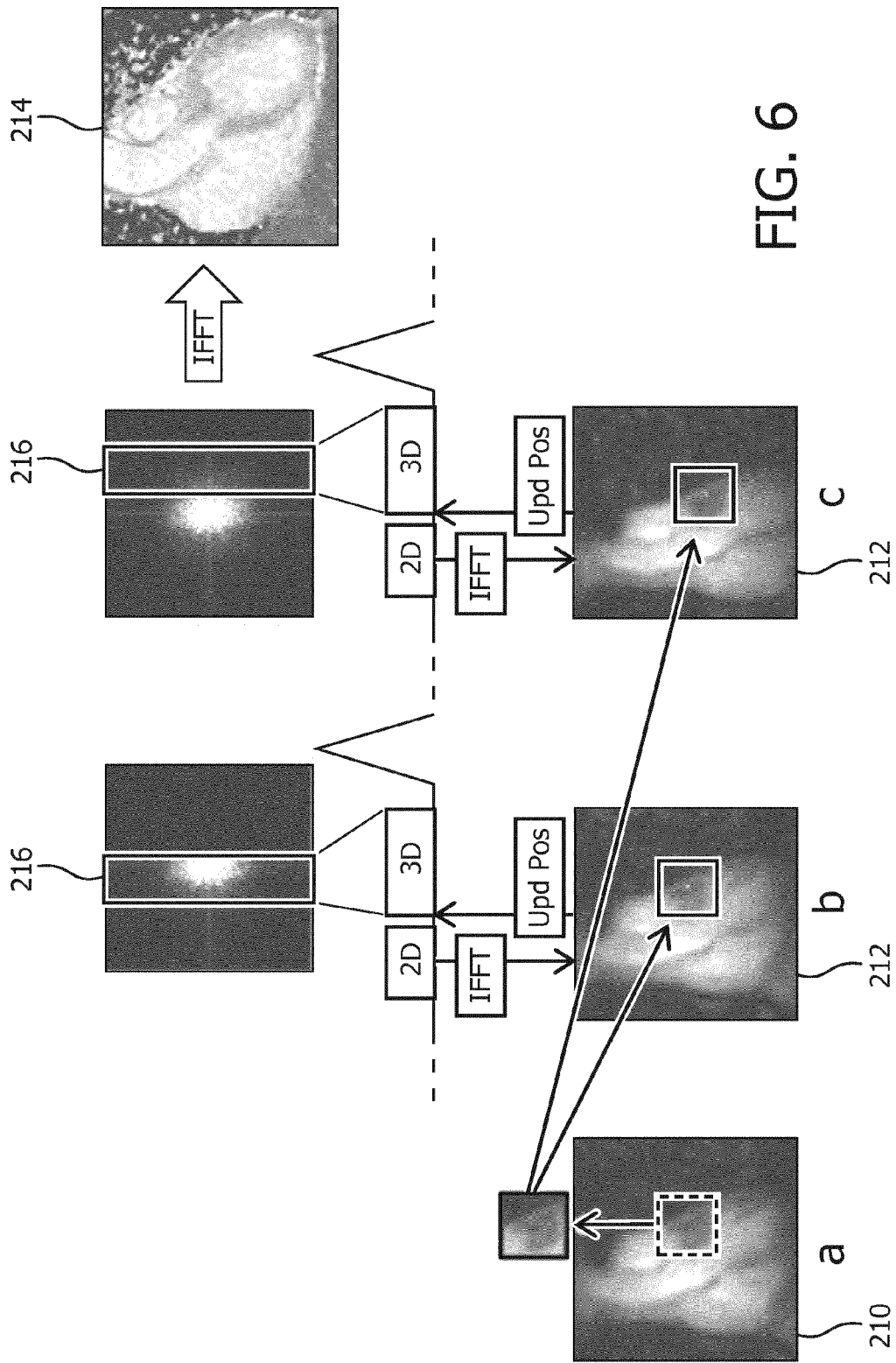
FIG. 6 is a diagram depicting motion detection and correction in accordance with the method according to the first embodiment.
Figure 7:
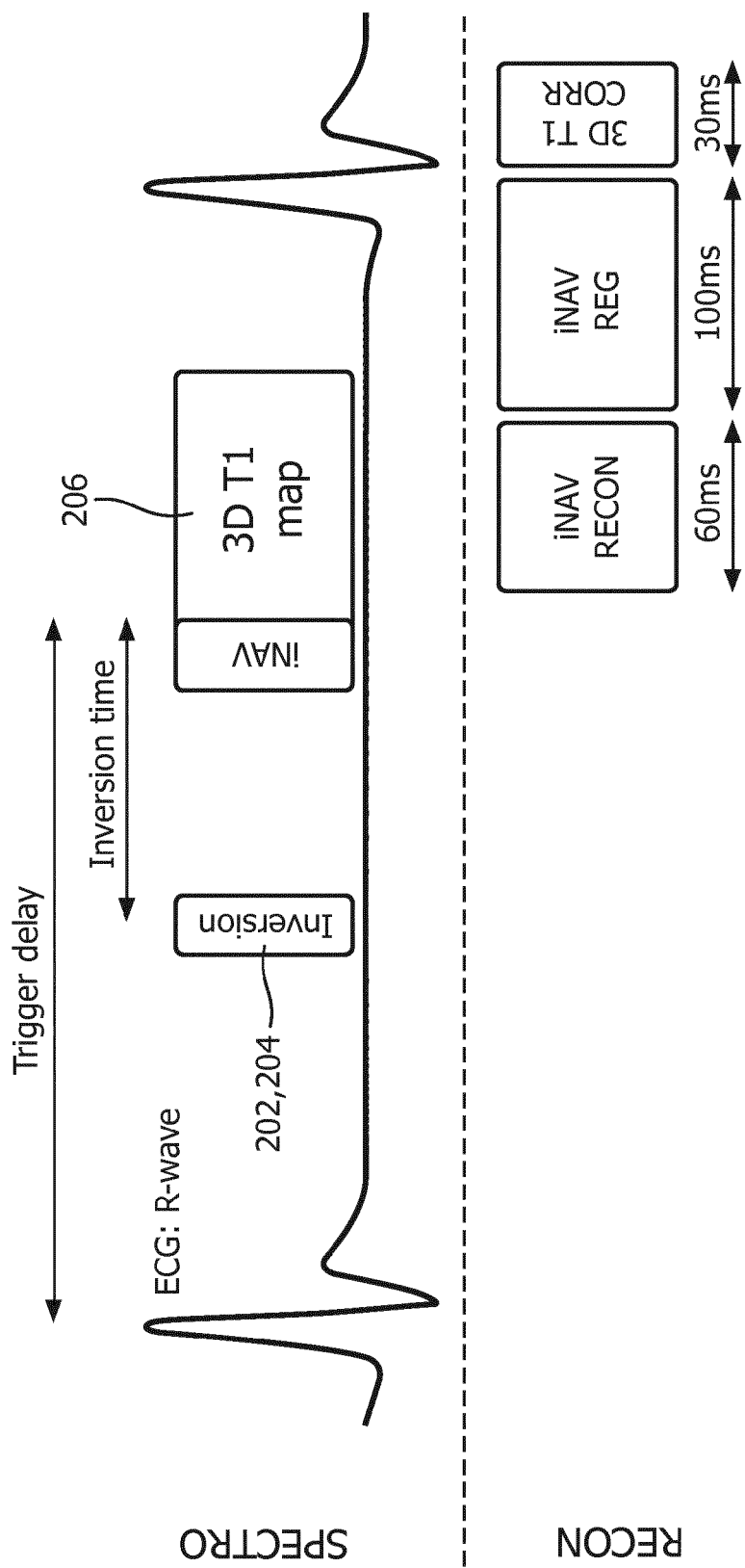
FIG. 7 is an exemplary timing diagram indicating the timing of a readout and subsequent image detection and image correction in accordance with the method according to the first embodiment.

Details in respect to motion detection step S130 and motion correction step S140 are shown in FIGS. 6 and 7. In FIG. 6 motion correction is shown by way of example for one image 212 out of the scanning sequence 200. The image 212 corresponds to the same readout 206 out of the scanning sequence 200 as the respective reference image. Accordingly, a series of images 212 corresponding to the same inversion time are compared. The motion detection and correction is applied to all images 212 of each scanning sequence 200 according to the principles shown below. Hence, contrast modifications of the images 212, as seen in FIG. 4 based on the different configurations of the readouts 206, i.e. the different inversion times of the readouts 206 after the T1 pre-pulses 202, 204, do not affect motion determination and correction.

Based on the navigator images 210 and the images 212 provided during the examination phase, translational motion correction is performed in foot-head and left-right direction to achieve high scan efficiency.

As can be seen in FIG. 6, image 212 based navigation in segmented k-space acquisition is performed. 2D navigator images 210 are reconstructed and motion correction is applied in real time to the acquired k-space segment. The navigator image 210 is acquired as discussed above in the preparation phase. The images 212 shown with respect to b and c in FIG. 6 are acquired during the examination phase. Subsequent acquisitions of the 3D scan 216 are corrected for motion. In this example motion correction is shown for one image 212 with inversion time TI=60 ms out of a series of images 212 after the T1 pre-pulses 202, 204. The series of images 212 with different contrasts can be seen by way of example in for the navigator images 210 in FIG. 5.

Further details can be seen in FIG. 7, which refers to an exemplary timing diagram of a readout 206 and real-time image correction. The upper part of FIG. 7 refers to spectrometic operation of the MR imaging system 110, where the pre-pulse 202, 204 is generated and a readout 206 is performed after the given inversion time. The lower part of FIG. 7 refers to the image reconstruction based on the detected motion of the subject of interest 120, i.e. motion correction. As can be seen in FIG. 7, motion detection and motion correction starts already during the acquisition of k-space samples of the readout 206. First, the navigator image 210 is recognized, shown as iNAV RECON in FIG. 7, which takes a time of approx. 60 ms in this embodiment. Next, the navigator image 210 is registered, i.e. motion is detected with respect to the navigator image 210, shown as iNAV REG in FIG. 7, which takes a time of approx. 100 ms in this embodiment. Finally, motion correction is performed, shown as 3D T1 CORR in FIG. 7, which takes a time of approx. 30 ms in this embodiment.

In this embodiment, a template matching algorithm is used for image 212 registration thereby deriving motion information in real time (RT), as can be seen in FIG. 6. The similarity measure used for the template matching algorithm is a normalized cross correlation, and in this context, the algorithm provides translational displacement information along the two image dimensions, which correspond in this embodiment to the head-foot and the left-right directions of the subject of interest 120. The normalized cross correlation γ(u,v) of an image 212, here referred to as f(x,y), and template t(u,v) can be expressed by $$\gamma(u,v) = \frac{\sum_{x,y}[f(x,y) - \overline{f}_{u,v}][t(x-u,y,v) - \overline{t}]}{\sqrt{\sum_{x,y}[f(x,y) - \overline{f}_{u,v}]^2 [t(x-u,y,v) - \overline{t}]^2}}$$

where the summation of x, y is the region of f(x,y) under the template, and $\overline{t}$ and $\overline{f}$ are the means of the respective functions in the area. RT motion correction is implemented by adjusting the detection frequency in the readout direction and as a phase shift applied to the respective k-space lines of the imaging sequence in the phase. If the MR imaging refers to 3D imaging, slice encoding direction is also adjusted. Correction in the slice selection direction is achieved by a slice or slab position offset of the respective radiofrequency pulse of the imaging sequence. The scalar projection v of the 2Dnav encoding direction onto the imaging sequence coordinate system is calculated to relate the navigator motion estimation along its two dimensions to the frequency, phase, and slice encoding of the imaging sequence. The total phase shift θA along the encoding direction A for a shot t is calculated by summing the contribution of each motion projection $$\theta_A(t) = \frac{2\pi \cdot v_x \cdot \Delta x(t)}{FOV_A} + \frac{2\pi \cdot v_y \cdot \Delta y(t)}{FOV_A}$$

where $v_x$ and $v_y$ represents the scalar projections of the 2Dnav readout and phase encoding directions, respectively, onto the imaging coordinate system, and $\Delta_x$ and $\Delta_y$ the navigator motion measurements at shot t.

In alternative embodiments, countermeasures comprise adaptation of the position of the subject of interest 120 and/or post-processing of the data after the readouts 206.

The method returns to step S120 to continue the examination phase until all required k-space samples have been acquired. In that case, the method continues with step S150.

In step S150, an MR scan of the heart of the subject of interest 120 is provided based on the readouts 206. Based on the motion detection and motion correction, the different k-space segments are combined to provide a 3D MR scan 214 of the heart, i.e. a cardiovascular MR scan in this embodiment, as indicated in FIG. 4. Accordingly, all readouts 206 of the scanning sequences 200 applied during the examination phase are used for generation of the 3D cardiovascular MR scan 214. Hence, the images 212 are combined under consideration of the detected motion to provide the 3D cardiovascular MR scan 214, and a T1 map is generated based on images 212 representing five different inversion times. The T1 map is acquired covering the whole region of interest 142, i.e. the heart, with a 2 mm isotropic resolution and otherwise standard T1 mapping imaging parameters, e.g. a flip angle of 35° and TR=2.4 ms.

In one embodiment, a computer-readable medium such as a storage device, a floppy disk, compact disc, CD, digital versatile disc, DVD, Blu-ray disc, or a random access memory, RAM, is provided that contains a set of instructions that causes the control unit 126 of the MR imaging system 110 to perform the above method.

Accordingly, a computer program product comprising a computer-usable medium including computer-usable program code is provided, wherein the computer-usable program code is adapted to execute the above method.

In a further embodiment a software package is provided for upgrading a MR imaging system 110, whereby the software package contains instructions for controlling the MR imaging system 10 to perform the above method.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
142 region of interest
200 scanning sequence
202 first T1 pre-pulse
204 second T1 pre-pulse
206 readout
208 electrocardiogram, heartbeat signal
210 navigator image
212 image
214 MR scan
216 3D scan

The invention claimed is:

1. A method for magnetic resonance (MR) imaging of a region of interest of a subject of interest under application of a scanning sequence comprising at least one pre-pulse and multiple readouts, whereby the multiple readouts are performed after the at least one pre-pulse with different configurations causing different image contrasts, comprising the steps of:

performing a preparation phase comprising applying the scanning sequence to provide a set of reference readouts using the different configurations, and generating a set of navigator images with one navigator image of the region of interest for each configuration of the reference readouts, performing an examination phase comprising applying the scanning sequence, whereby at least one image of the region of interest is generated for each scanning sequence, determining motion of the subject of interest by comparing at least one image of the scanning sequence of the examination phase to the navigator image having the same configuration as the compared image;

performing motion correction of the at least one image based on the determined motion of the subject of interest of the at least one image; and providing an MR scan of the region of interest of the subject of interest (120) based on the images after performing motion correction.

2. The method for magnetic resonance imaging according to preceding claim 1, wherein
the multiple readouts are performed with different delays after the at least one pre-pulse.

3. The method for magnetic resonance imaging according to claim 1, wherein
the method for MR imaging is performed as a method for MR imaging of the torso and the region of interest of the subject of interest is within a torso of the subject of interest.

4. The method for magnetic resonance imaging according to claim 3, wherein the method of MR imaging of the torso is a method for cardiovascular MR imaging and the region of interest of the subject of interest is the heart of the subject of interest.

5. The method for magnetic resonance imaging according to claim 3, wherein the region of interest is any one of the following: a liver, a spleen, a rectum, a kidney, an abdominal organ, a lung, and combinations thereof.

6. The method for magnetic resonance imaging according to claim 1, wherein
the step of performing a preparation phase comprises issuing a breath-hold command to the subject of interest, and executing at least one scanning sequence under breath-hold condition.

7. The method for magnetic resonance imaging according to claim 1, wherein
the step of performing a preparation phase comprises executing at least one scanning sequence under free-breathing condition using a 1D navigator.

8. The method for magnetic resonance imaging according to claim 1, wherein
the step of applying at least one scanning sequence comprises applying a scanning sequence having multiple pre-pulses and multiple readouts, whereby each pre-pulse is followed by at least one readout.

9. The method for magnetic resonance imaging according to preceding claim 8, wherein
the step of applying a scanning sequence having multiple pre-pulses and multiple readouts comprises adding a recovery time prior to generating a pre-pulse.

10. The method for magnetic resonance imaging according to claim 1, wherein
the method comprises the step of monitoring a motion detection signal of the subject of interest, and
the step of applying at least one scanning sequence comprises triggering the scanning sequence based on the motion detection signal of the subject of interest.

11. The method for magnetic resonance imaging according to claim 10, wherein the motion detection signal is a respiratory signal.

12. The method for magnetic resonance imaging according to claim 10, wherein the motion detection signal is a heartbeat signal.

13. The method for magnetic resonance imaging according to claim 12, wherein the heartbeat signal is an ECG signal.

14. The method for magnetic resonance imaging according to claim 1, wherein
the step of performing an examination phase comprises performing segmented k-space acquisition.

15. The method for magnetic resonance imaging according to claim 1, wherein
the step of generating a set of navigator images with one navigator image for each configuration of the reference readouts comprises generating 2D or 3D navigator images for each configuration of the reference readouts.

16. The method for magnetic resonance imaging according to claim 1, wherein
the step of performing an examination phase comprises performing the examination phase as free-breathing examination phase.

17. The method for magnetic resonance imaging according to claim 1, wherein
the step of determining motion of the subject of interest by comparing at least one image of the scanning sequence of the examination phase to the navigator image having the same configuration as the compared image comprises determining the motion of the subject of interest in real-time.

18. The method for magnetic resonance imaging according to preceding claim 17, wherein
the step of performing motion correction based on the determined motion of the subject of interest in real-time comprises performing real-time motion correction by adjusting MR scanning parameters for compensation of detected motion of the subject of interest.

19. The method for magnetic resonance imaging according to preceding claim 18, wherein
the step of performing real-time motion correction by adjusting MR scanning parameters for compensation of detected motion of the subject of interest comprises adjusting detection frequency in the readout direction, detection phase in the readout direction, and/or slice encoding direction.

20. The method for magnetic resonance imaging according to claim 1, wherein the pre-pulse is a T1 pulse or a T2 pulse.

21. A software package for upgrading a MR imaging system, whereby
the software package contains instructions stored on a non-transitory computer readable medium for controlling the MR imaging system according to the method of claim 1.

22. A MR imaging system for providing an image representation of a region of interest of a subject of interest positioned in an examination space of the MR imaging system, wherein
the MR imaging system is adapted to perform the method for MR imaging according to claim 1.

* * * * *